(12) United States Patent
Straub

(10) Patent No.: US 11,433,737 B2
(45) Date of Patent: Sep. 6, 2022

(54) COOLING DEVICE AND METHOD FOR THE REDUNDANT COOLING OF A CONTROL UNIT FOR A VEHICLE

(71) Applicant: Robert Bosch GmbH, Stuttgart (DE)

(72) Inventor: Hubert Straub, Tuebingen (DE)

(73) Assignee: Robert Bosch GmbH, Stuttgart (DE)

(*) Notice: Subject to any disclaimer, the term of this patent is extended or adjusted under 35 U.S.C. 154(b) by 101 days.

(21) Appl. No.: 16/713,365

(22) Filed: Dec. 13, 2019

(65) Prior Publication Data
US 2020/0198440 A1 Jun. 25, 2020

(30) Foreign Application Priority Data

Dec. 20, 2018 (DE) .................. 102018222668.7

(51) Int. Cl.
| | | |
|---|---|---|
| *B60H 1/00* | (2006.01) | |
| *F28D 7/00* | (2006.01) | |
| *H05K 7/20* | (2006.01) | |
| *B60H 1/32* | (2006.01) | |

(52) U.S. Cl.
CPC ....... *B60H 1/00978* (2013.01); *F28D 7/0083* (2013.01); *H05K 7/20254* (2013.01); *H05K 7/20872* (2013.01); *B60H 1/32281* (2019.05)

(58) Field of Classification Search
CPC .......... H05K 7/20872; H05K 7/20845–20881; H05K 7/20218; H05K 7/20254; G06F 1/206; G06F 2200/201; B60W 50/023; B60W 2050/0292
See application file for complete search history.

(56) References Cited

U.S. PATENT DOCUMENTS

| | | | | |
|---|---|---|---|---|
| 5,438,226 | A  * | 8/1995 | Kuchta ................... | G06F 1/206 307/125 |
| 6,213,194 | B1 * | 4/2001 | Chrysler .................. | F28F 3/12 165/80.3 |
| 6,807,056 | B2 * | 10/2004 | Kondo ...................... | G06F 1/20 165/104.33 |
| 7,569,954 | B2 * | 8/2009 | Tolle ....................... | H02K 9/19 310/54 |
| 9,145,210 | B2 * | 9/2015 | Casas Noriega ...... | B64D 13/00 |
| 9,468,132 | B2 * | 10/2016 | Taguchi ............. | H05K 7/20281 |
| 10,481,652 | B2 * | 11/2019 | Rice ..................... | H01L 23/473 |
| 11,153,994 | B1 * | 10/2021 | Lo ..................... | H05K 7/20272 |
| 2020/0198440 | A1 * | 6/2020 | Straub ................ | B60H 1/00814 |

FOREIGN PATENT DOCUMENTS

DE  102006059418 A1  6/2008

* cited by examiner

*Primary Examiner* — Jenna M Hopkins
(74) *Attorney, Agent, or Firm* — Norton Rose Fulbright US LLP; Gerard Messina

(57) ABSTRACT

A cooling device for the redundant cooling of a control unit for a vehicle. The control unit has a first electronic component and a second electronic component that is redundant with respect to the first electronic component. The cooling device has a first cooling circuit for cooling the first electronic component and a second cooling circuit, fluidically separated from the first cooling circuit, for cooling the first and/or second electronic component.

8 Claims, 3 Drawing Sheets

COOLING DEVICE AND METHOD FOR THE REDUNDANT COOLING OF A CONTROL UNIT FOR A VEHICLE

CROSS REFERENCE

The present application claims the benefit under 35 U.S.C. § 119 of German Patent Application No. DE 102018222668.7 filed on Dec. 20, 2018, which is expressly incorporated herein by reference in its entirety.

FIELD

The present invention is based on a cooling device and a method. A computer program is also a subject matter of the present invention.

BACKGROUND INFORMATION

Since in particular the automotive industry is increasingly focusing on autonomously driving vehicles, the reliability and safety of the installed systems are especially important.

SUMMARY

The present invention provides an example method, furthermore an example cooling device using this method, and finally a corresponding computer program. As a result of the measures described herein, advantageous refinements and improvements of the cooling device in accordance with the present invention are possible.

In accordance with the present invention, an improved cooling device is provided as well as an improved method for the redundant cooling of a control unit for a vehicle so that the occupants of the vehicle are not in danger even in the event of a failure of the installed systems.

The cooling device is designed to cool a control unit for a vehicle. In this instance, the control unit has a first electronic component and a second electronic component that is redundant with respect to the first electronic component. The cooling device has a first cooling circuit for cooling the first electronic component. The cooling device furthermore has a second cooling circuit, which is fluidically separated from the first cooling circuit, for cooling the first and/or second electronic component.

The vehicle may be implemented for example as an autonomous vehicle for transporting persons and/or objects. The control unit may represent processing units and/or processors that control safety-related functions of the vehicle for example. The first electronic component as well as the second electronic component may be for example a component of the control unit or a control device. The electronic components may be processors or microcontrollers for example. Advantageously, due to the redundancy of the electronic components and the cooling circuits running independently of each other, it is possible to maintain particularly safety-related functions of the vehicle, which are implemented in the respective electronic components, in the event of a system failure.

According to one specific embodiment, the first cooling circuit may be designed to cool also the second electronic component. Advantageously, the second electronic component thereby remains operational even if the second cooling circuit fails.

According to one specific embodiment, the cooling device may have a third and/or a fourth electronic component that is redundant with respect to the third electronic component, the first cooling circuit being designed to cool a third and/or fourth electronic component. Advantageously, the first cooling circuit is able to cool multiple electronic components so that a manifold use of this already implemented cooling circuit is achievable.

According to one specific embodiment, the second cooling circuit may be designed to cool the third and/or fourth electronic component. An advantageous manifold use of the second cooling circuit may thus be achieved as well, which makes it possible to increase the functional reliability of the third and/or fourth electronic component.

Advantageously, the second cooling circuit also cools multiple electronic components so that the safety of the vehicle occupants may be ensured by the functions of the vehicle implemented in these components and that an implemented cooling circuit may be utilized for multiple cooling functions.

According to one specific embodiment, the first cooling circuit may be designed to cool as the first electronic component a control unit for controlling an autonomous driving function of the vehicle and/or a processor, and/or the second cooling circuit may be designed to cool as the second electronic component a control unit for controlling an autonomous driving function of the vehicle and or a processor. The control unit may be developed as a processing unit for example, which evaluates incoming signals and provides outgoing signals to vehicle components and thereupon controls for example vehicle components such as the brake of the vehicle. Specifically the cooling of a processor or of a control unit for controlling autonomous driving often requires increased cooling effort since in such a processor or control unit the processing units executing the multitude of control tasks to be performed in modern vehicles often have a high electrical energy consumption and a correspondingly high thermal energy must be dissipated from these control units.

According to one specific embodiment, the first cooling circuit may be designed to cool at least one other electronic component than the second cooling circuit. This makes it possible to ensure that in the event of a failure of one of the cooling circuits it is still possible to continue to ensure the functioning of other electronic components that need to be cooled, which are not connected to the failed cooling circuit.

According to one specific embodiment, the first cooling circuit may be designed to cool at least one identical electronic component as the second cooling circuit. This advantageously makes it possible to ensure the functioning of the electronic component since the respective electronic component may then also be cooled by the second cooling circuit if the first cooling circuit has failed. This not only allows for a redundancy with respect to the implementation of the desired function in different electronic components, but also the redundancy of the cooling of the respective components.

According to one specific embodiment, the first cooling circuit and/or the second cooling circuit may be designed in order to cool, in serial or parallel fashion, electronic components situated in the respective cooling circuit. Advantageously, this makes it possible to design the arrangement of the electronic components in variable fashion so that for example depending on their construction type they may be positioned differently. At the same time, it is also possible to achieve an advantageous, for example short path of the coolant in the respective cooling circuits, specifically if in one or multiple electronic components no exceedingly high heat dissipation requirement is to be expected, which would require a separate cooling circuit for cooling these electronic components.

According to one specific embodiment, the first electronic component may have a first cooling body for routing a first conduit of the first cooling circuit and/or the second electronic component may have a second cooling body for routing a second conduit of the second cooling circuit. Both the first conduit as well as the second conduit may be implemented for example in the form of hoses or tubes, through which a cooling fluid is able to flow. In the process, heat is dissipated from the cooling body into the conduit in order advantageously to prevent overheating. Furthermore, the integration of the respective conduit in a cooling body may be advantageous in that the heat to be dissipated is usually concentrated or is collected on the cooling body or is collected so that the dissipation is particularly efficient in this location.

The method for cooling a control unit for a vehicle having a cooling device according to a variant provided here comprises a first step of cooling as well as a second step of cooling. In the first step of cooling, a first electronic component is cooled in a first cooling circuit. In the second step of cooling, the first and/or a second electronic component is cooled in a second cooling circuit.

This advantageously ensures at least an emergency supply of the safety-related functions of the vehicle so as to reduce the risk of an accident.

This method may be implemented for example in software or hardware or in a mixed form of software and hardware, for example in a control unit.

The approach provided here furthermore creates a device which is developed to carry out, control or implement the steps of a variant of a method provided here in corresponding devices. This variant of an embodiment of the present invention in the form of a device is also able to achieve the objective of the present invention quickly and efficiently.

For this purpose, the device may include at least one processing unit for processing signals or data, at least one memory unit for storing signals or data, at least one interface to a sensor or an actuator for reading in sensor signals from the sensor or for outputting data signals or control signals to the actuator and/or at least one communication interface for reading in or outputting data that are embedded in a communication protocol. The processing unit may be for example a signal processor, a microcontroller or the like, while the memory unit may be a flash memory, an EEPROM or a magnetic memory unit. The communication interface may be designed to read in or output data wirelessly and/or in line-conducted fashion, a communication interface that is able to read in or output line-conducted data being able to read in these data for example electrically or optically from a corresponding data transmission line or output them to a corresponding data transmission line.

In the present case, a device may be understood to refer to an electrical device that processes sensor signals and outputs control signals and/or data signals as a function thereof. The device may include an interface developed in the form of hardware and/or software. In a hardware implementation, the interfaces may be part of a so-called system ASIC, for instance, which encompasses a wide variety of functions of the device. However, it is also possible for the interfaces to be separate, integrated circuits or to be at least partially made up of discrete components. In a software development, the interfaces may be software modules which, for example, are present on a microcontroller in addition to other software modules.

In one advantageous development, the device controls an autonomous vehicle. For this purpose, the device is able to access sensor signals such as braking signals and steering signals. The control is implemented via actuators such as brakes and steering devices.

In the present case, a device may be understood to refer to an electrical apparatus that processes sensor signals and outputs control signals and/or data signals as a function thereof. The sensor signals may be for example signals of a sensor of the motor vehicle or of a sensor installed in a motor vehicle. The sensor signals may thus be signals of a gas sensor, for example of a lambda probe; a pressure sensor, which is installed for example in a bumper; or an acceleration sensor, for example an ESP sensor. The control and/or data signals may be signals that are transmitted to a control unit, for example a brake control unit or an engine control unit. On the basis of these signals, the control unit is able to decide whether in the event of a malfunction of the tested sensor a warning signal is output and/or an emergency operation program is activated, which controls specific units such as e.g. brake actuators in the motor vehicle and/or deactivates specific units of the motor vehicle in order thus to bring about a safe operating state.

Also advantageous is a computer program product or computer program having program code that may be stored on a machine-readable carrier or memory medium such as a semiconductor memory, a hard-disk memory or an optical memory, and which is used to carry out, implement and/or control the steps of the method according to one of the specific embodiments described above, in particular when the program product or program is executed on a computer or a device.

Exemplary embodiments of the present invention are depicted in the figures and described in greater detail below.

DETAILED DESCRIPTION OF EXAMPLE EMBODIMENTS

Figure 1:
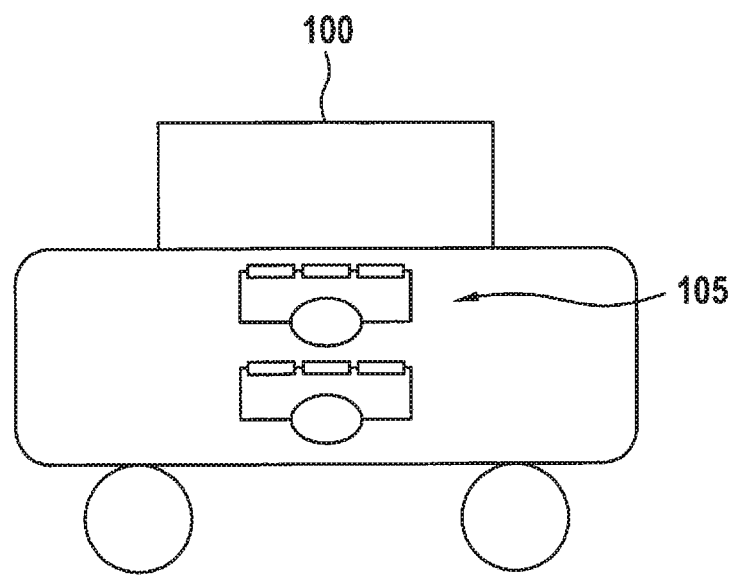
FIG. 1 shows a schematic illustration of a vehicle having a cooling device according to one exemplary embodiment.

In the description below of advantageous exemplary embodiments of the present invention, identical or similar reference numerals are used for elements shown in the various figures that act similarly, a repeated description of these elements being omitted in this case.

FIG. 1 shows a schematic illustration of a vehicle 100 having a cooling device 105 according to one exemplary embodiment. According to one exemplary embodiment, cooling device 105 has two different cooling circuits. Vehicle 100 is designed to transport persons and/or objects. According to one exemplary embodiment, vehicle 100 is autonomous. Cooling device 105 is designed to cool in particular those electronic components that implement safety-related functions of vehicle 100 in order to prevent these from overheating. According to one exemplary embodiment, two cooling circuits that are independent of each other are advantageous and are used for this purpose so that even in the event of a failure of one cooling circuit of the cooling circuits it is still possible to perform at least the safety-related functions. According to one exemplary embodiment, cooling device 105 may be constructed differently. In other words, by using two separate cooling circuits, it is possible to continue to cool the electronic components or at least one of the redundant electronic components in the event of a failure with the aid of one of the cooling circuits.

Expressed differently, it is currently not known that efforts are made for safety-related applications in the automotive sector to use a duplicate design for water cooling. The duplicate design is currently considered only for control units and processors. In analogous form, there are duplicate or even triplicate designs of hydraulic systems in airplanes. Here, the hoses of the duplicate systems are in part even routed differently in order to minimize the risk, in the event of damage (in particular military airplanes), that additional conduits are damaged.

The safety and reliability of systems for autonomous driving are particularly important. In current planning, there is only one cooling circuit, to which all (redundant) control units are connected serially or in parallel.

This creates the great risk that in the event of a failure of this one water cooling system all control units and processors are simultaneously no longer cooled. Then all system would also fail simultaneously due to overheating. This means that it is no longer possible to ensure the redundancy, in the event of a failure of any component, to be able to take over its function. For this reason, in an autonomous vehicle the water cooling system should be designed in duplicate fashion for example. For all systems that are relevant for the safety in autonomous driving, at least two separate cooling circuits are then used, which may include a water pump, a cooler grille, suitable components of a hose system and a water cooling body (and additional components) for cooling the redundant control units. By using two separate cooling circuits, it is possible to continue to cool reliably and to maintain the relevant functions in the redundantly designed control units and processors (CPU, GPU, or for example all components to be cooled) in the event of a failure of one of the cooling systems. The strategy for this purpose may be pursued in three different variants. The implementation of the separate fluid routing may also be performed constructionally in all known systems such as channels, pipes, micro-channel cooler, jet cooling, spray cooling etc. Redundant control units continue to be supplied for example serially or in parallel by the two cooling systems.

Figure 2:
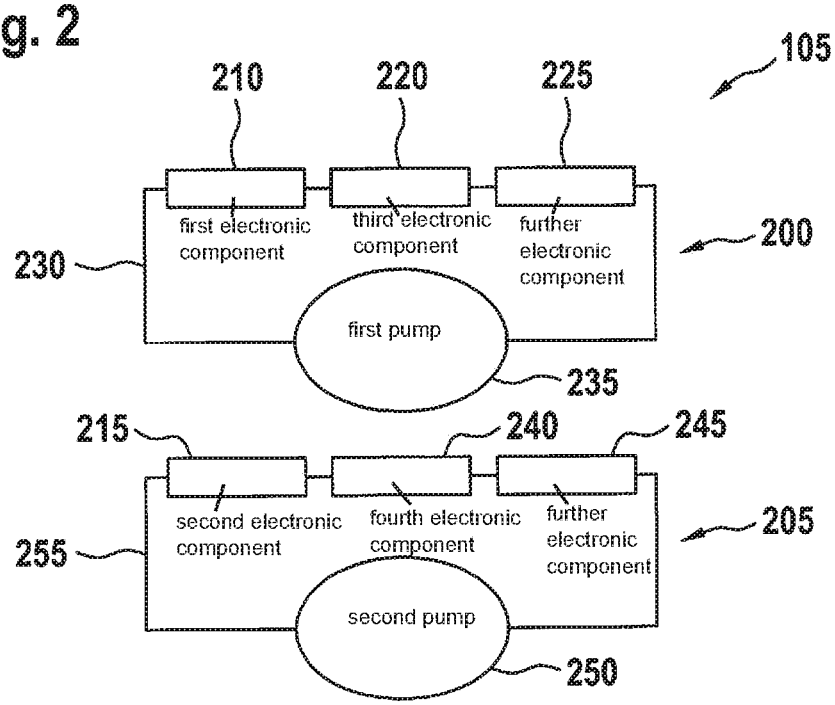
FIG. 2 shows a schematic illustration of a cooling device according to one exemplary embodiment.

FIG. 2 shows a schematic illustration of a cooling device 105 according to one exemplary embodiment. Cooling device 105 may be implemented in a vehicle 100, as illustrated in FIG. 1. According to one exemplary embodiment, the cooling device 105 illustrated in this figure may be regarded as a first variant. According to this exemplary embodiment, the cooling device has a first cooling circuit 200 as well as a second cooling circuit 205. According to one exemplary embodiment, first cooling circuit 200 has a first electronic component 210. According to one exemplary embodiment, second cooling circuit 205 has a second electronic component 215. The first cooling circuit 200 is designed to cool first electronic component 210. The second cooling circuit 205 is designed to cool second electronic component 215. According to one exemplary embodiment, it is possible for both the first component 210 as well as the second component 215 to be implemented as a processor, in which a function is implemented that is critical with respect to safety for the operation of the vehicle. In addition, first cooling circuit 200 has a third electronic component 220 as well as a further electronic component 225, which are connected in series with first electronic component 210 according to this exemplary embodiment. The electronic components 210, 220, 225 of first cooling circuit 200 are connected by a first conduit 230. First conduit 230 is designed to conduct a cooling fluid. A first pump 235 is designed to pump the cooling fluid, which may also be referred to as cooling medium, through first conduit 230. According to this exemplary embodiment, second cooling circuit 205 is constructed in analogous fashion to first cooling circuit 200. As already mentioned, second cooling circuit 205 has second electronic component 215. Furthermore, second cooling circuit 205 has a fourth electronic component 240 as well as a further electronic component 245 and a second pump 250. In second cooling circuit 205, electronic components 215, 240, 245 are also connected in series by a second conduit 255. According to one exemplary embodiment, second cooling circuit 205 is redundant with respect to first cooling circuit 200. If first cooling circuit 200 fails for example, then it is possible for the functions of the electronic components of first cooling circuit 200 to be performed by the respective redundant components of second cooling circuit 205. In other words, each cooling circuit 200, 205 respectively cools one of redundant components 210, 215.

Figure 3:
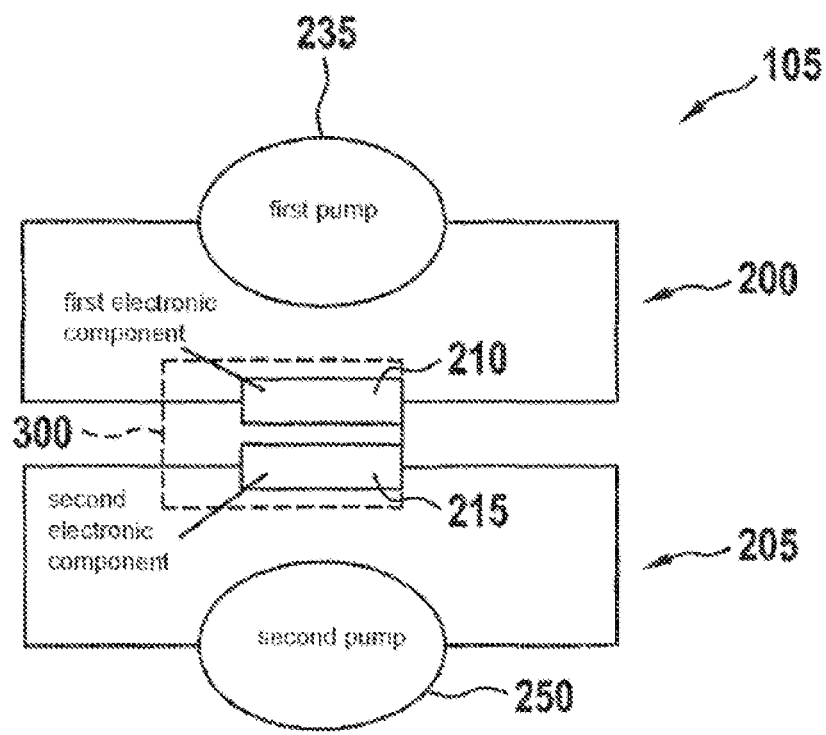
FIG. 3 shows a schematic illustration of a cooling device according to one exemplary embodiment.

FIG. 3 shows a schematic illustration of a cooling device 105 according to one exemplary embodiment. The cooling device 105 illustrated here may be implemented in a vehicle 100, as was illustrated in FIG. 1. The cooling device 105 illustrated in this exemplary embodiment may be considered as an alternative to the cooling device 105 described in FIG. 2. As in FIG. 2, cooling device 105 in FIG. 3 also has two cooling circuits 200, 205 separated from each other as well as a pump 235, 250 in each cooling circuit 200, 205. According to this exemplary embodiment, cooling device 105 has a control unit 300, which in turn comprises a first electronic component 210 and a second electronic component 215. Electronic components 210 and 215 are implemented as processors according to this exemplary embodiment. Although both first cooling circuit 200 as well as second cooling circuit 205 run through control unit 300, only first electronic component 210 is cooled by first cooling circuit 200. In just the same manner, second cooling circuit 205 only cools second electronic component 215. Here too, second electronic component 215 is redundant with respect to first electronic component 210. In other words, each coolant circuit 200, 205 respectively cools one of the electrical components 210, 215 within a control unit 300, which are indeed distinct (situated at a distance from each other for example), but which are redundant in their function. For this purpose, cooling circuits 200, 205 are kept separate within control unit 300.

Figure 4:
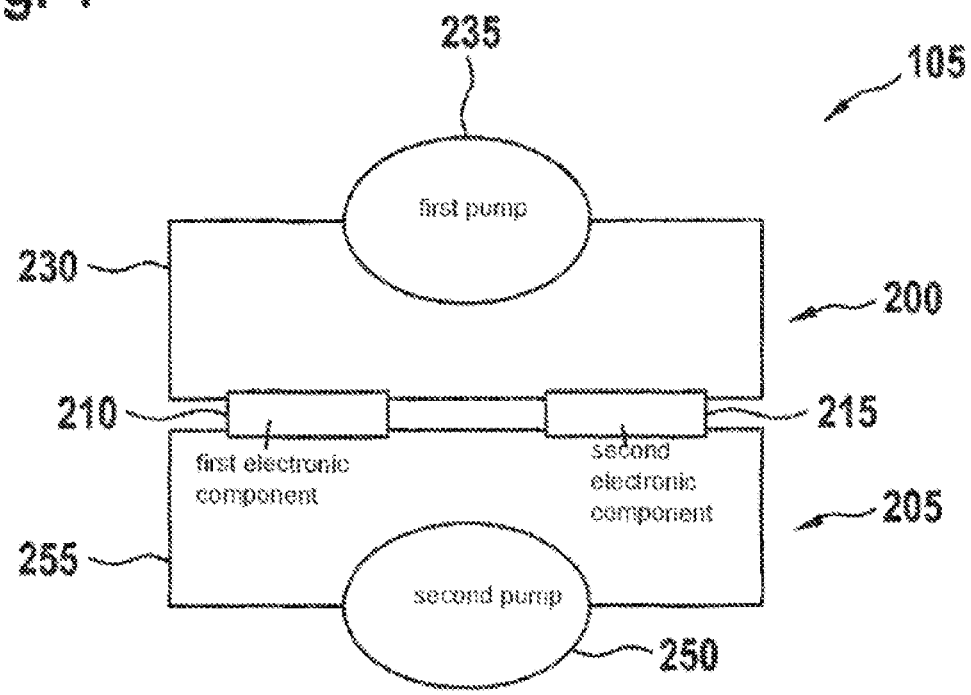
FIG. 4 shows a schematic illustration of a cooling device according to one exemplary embodiment.

FIG. 4 shows a schematic illustration of a cooling device 105 according to another exemplary embodiment. The cooling device 105 illustrated here may be implemented in a vehicle 100, as was illustrated in FIG. 1. The cooling device 105 illustrated in this exemplary embodiment may be considered as an alternative to the cooling device 105 described in FIG. 2 or in FIG. 3. As in FIG. 2, cooling device 105 in FIG. 4 also has two cooling circuits 200, 205 separated from each other as well as a pump 235, 250 in each cooling circuit 200, 205. According to this exemplary embodiment, both the first cooling circuit 200 as well as the second cooling circuit 205 run through both electronic components 210, 215 of cooling device 105. In other words, each component 210, 215 is cooled in that the cooling fluids of the two cooling circuits 200, 205 flow independently through the same cooling body. In this instance, first conduit 230 and second conduit 255 of cooling circuits 200, 205 in the cooling body continue to be kept separate so that in the event of a failure of one of cooling circuits 200, 205, the other cooling circuit is able to cool the electronic components 210, 215.

Figure 5:
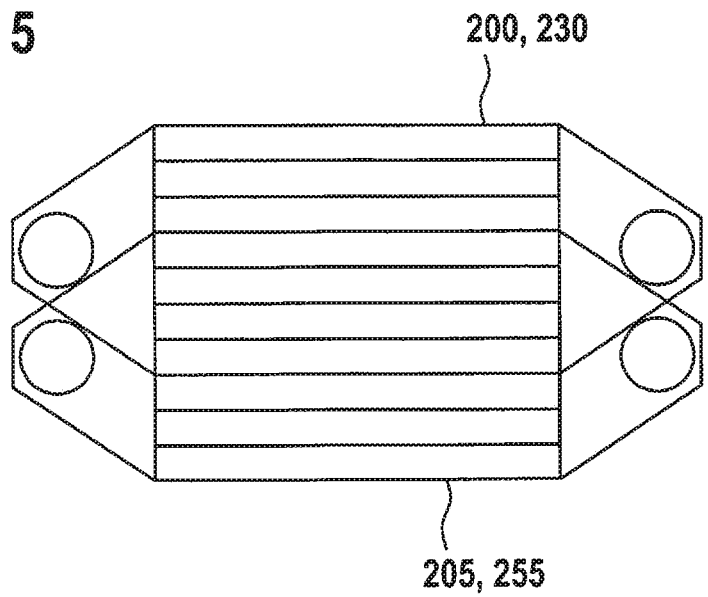
FIG. 5 shows a schematic illustration of conduits running in parallel within a cooling body according to one exemplary embodiment.

FIG. 5 shows a schematic illustration of conduits 230, 255 running in parallel within a cooling body according to one exemplary embodiment. According to one exemplary embodiment, it is possible to implement such an arrangement in the cooling device shown in FIG. 4. FIG. 5 shows a detail drawing, according to which both separate cooling circuits 200 and 205 simultaneously cool component 210 (and possibly also 215). In this case, cooling circuits 200 and 205 mesh in such a way that they cool the entire area of component 210 and/or 215. Cooling circuits 200 and 205, however, continue to remain fluidically separated from each other entirely. As explained above, there are various designs (channels, jet cooling, . . . ) of the cooling body that cools the components. The geometric design of the conduits 230, 255 in the cooling body may be of any kind. This means that in the event of a failure only a portion of the cooling body is not supplied with the cooling fluid. According to one exemplary embodiment, conduits 230, 255 may split up into smaller channels within the cooling body so that the channels of first conduit 230 together with the channels of second conduit 255 are arranged in parallel, similar to the rungs of a ladder. The advantage of this is a temperature distribution that is as uniform as possible. If each individual cooling circuit, which may also be called a cooling system, is dimensioned to be sufficiently large, cooling may be maintained by a system, which continues to flow through the cooling body, and the vehicle could still be fully utilized. If each individual cooling circuit is dimensioned to be smaller, it would still be possible to implement an emergency operation of the vehicle following a failure of the cooling circuit, and the vehicle could stop in a controlled manner or could drive to a workshop at reduced speed.

Figure 6:
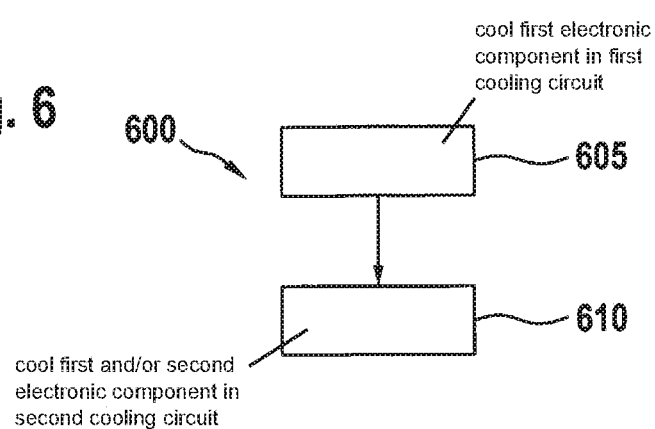
FIG. 6 shows a flow chart of a method for cooling a control unit for a vehicle having a cooling device according to one exemplary embodiment.

FIG. 6 shows a method 600 for cooling a control unit for a vehicle having a cooling device. Method 600 is preferably usable in a vehicle, as described in FIG. 1. The method comprises a first step 605 of cooling as well as a second step 610 of cooling. In first step 605, a first electronic component is cooled in a first cooling circuit. In second step 610, a first and/or a second electronic component is cooled in a second cooling circuit.

Figure 7:
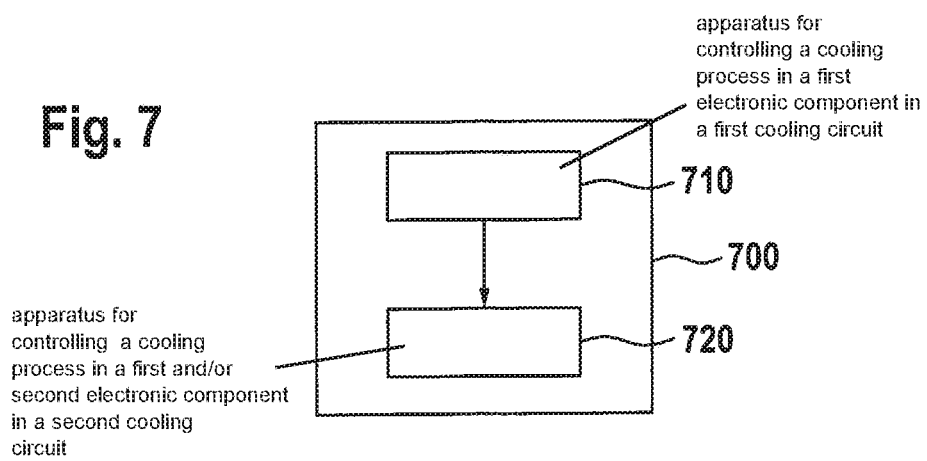
FIG. 7 shows a block diagram of a device according to one exemplary embodiment of the present invention for the redundant cooling of a control unit for a vehicle having a cooling device.

FIG. 7 shows a block diagram of a device 700 according to one exemplary embodiment of the present invention for redundant cooling of a control unit for a vehicle having a cooling device. The device comprises an apparatus 710 for controlling a cooling process in a first electronic component in a first cooling circuit. Device 700 further comprises another apparatus 720 for controlling a cooling process in a first and/or a second electronic component in a second cooling circuit. Device 700 itself and/or units 710 or 720 are designed to control for example corresponding actuators such as compressors or pumps in the respective cooling circuits and thereby to effect the cooling of the respective electronic components.

If an exemplary embodiment includes an "and/or" linkage between a first feature and a second feature, this is to be understood to mean that the exemplary embodiment according to one specific embodiment has both the first feature and the second feature, and according to another specific embodiment, either has only the first feature or only the second feature.

What is claimed is:

1. A device for a vehicle comprising:
a first electronic component that is configured to perform one or more controlling operations of the vehicle;
a second electronic component that is redundant to the first electronic component and is configured to perform the same one or more controlling operations of the vehicle as the first electronic component in response to failure of the first electronic component;
a cooling device for redundant cooling of the first electronic component and the second electronic component, the cooling device comprising:
a first cooling circuit configured to actively circulate cooling fluid using a respective pump of the first cooling circuit to thereby cool the first electronic component and the second electronic component; and
a second cooling circuit, fluidically separated from the first cooling circuit, and configured to actively circulate cooling fluid using a respective pump of the second cooling circuit to thereby cool the first electronic component and the second electronic component;
wherein:
the first cooling circuit includes a first plurality of channels in which the cooling fluid of the first cooling circuit is circulated and in which the cooling fluid of the second cooling circuit is not circulated;
the second cooling circuit includes a second plurality of channels in which the cooling fluid of the second cooling circuit is circulated and in which the cooling fluid of the first cooling circuit is not circulated;
the first plurality of channels and the second plurality of channels are meshed between one another forming a channel mesh under the first electronic component and under the second electronic component so that each of the first electronic component and the second electronic component spans over respective sections of one or more of the first plurality of channels and respective sections of one or more of the second plurality of channels, the first cooling circuit and the second cooling circuit thereby each being configured to independently cool each of the first electronic component and the second electronic component; and
the first electronic component and the second electronic component are arranged in series relative to the first plurality of channels and the second plurality of channels, so that, for each respective one of the channels, the respective channel passes below one of the first and second electronic components before passing under the other of the first and second electronic components with respect to a flow direction of the cooling fluid within the respective channel.

2. The cooling device as recited in claim 1, wherein the first cooling circuit is configured to cool the first electronic component independently of the second cooling circuit, and the second cooling circuit is also configured to cool the first electronic component independently of the first cooling circuit.

3. The cooling device as recited in claim 1, further comprising:
a third electronic component and/or a fourth electronic component that is redundant with respect to the third electronic component, wherein the first cooling circuit is configured to cool the third electronic component and/or the fourth electronic component.

4. The cooling device as recited in claim 3, wherein the second cooling circuit is configured to cool the third electronic component and/or the fourth electronic component.

5. The cooling device as recited in claim 1, wherein the one of more controlling operations includes controlling an autonomous driving function of the vehicle.

6. A method for redundant cooling of a control unit of a vehicle using a cooling device of the vehicle, the control unit including a first electronic component that is configured to perform one or more controlling operations of the vehicle and a second electronic component that is redundant to the first electronic component and is configured to perform the same one or more controlling operations of the vehicle as the first electronic component in response to failure of the first electronic component, the cooling device including a first cooling circuit and a second cooling circuit, the method comprising the following steps:
the first cooling circuit actively circulating cooling fluid using a respective pump of the first cooling circuit, thereby cooling the first electronic component and the second electronic component; and
the second cooling circuit, which is fluidically separated from the first cooling circuit, actively circulating cooling fluid using a respective pump of the second cooling circuit, thereby cooling the first electronic component and the second electronic component;
wherein:
the first cooling circuit includes a first plurality of channels in which the cooling fluid of the first cooling circuit is circulated and in which the cooling fluid of the second cooling circuit is not circulated;
the second cooling circuit includes a second plurality of channels in which the cooling fluid of the second cooling circuit is circulated and in which the cooling fluid of the first cooling circuit is not circulated;
the first plurality of channels and the second plurality of channels are meshed between one another forming a channel mesh under the first electronic component and under the second electronic component so that each of the first electronic component and the second electronic component spans over respective sections of one or more of the first plurality of channels and respective sections of one or more of the second plurality of channels, the first cooling circuit and the second cooling circuit thereby each being configured to independently cool each of the first electronic component and the second electronic component; and
the first electronic component and the second electronic component are arranged in series relative to the first plurality of channels and the second plurality of channels, so that, for each respective one of the channels, the respective channel passes below one of the first and second electronic components before passing under the other of the first and second electronic components with respect to a flow direction of the cooling fluid within the respective channel.

7. A non-transitory machine-readable storage medium on which is stored a computer program for redundant cooling of a control unit of a vehicle using a cooling device of the vehicle, the control unit including a first electronic component that is configured to perform one or more controlling operations of the vehicle and a second electronic component that is redundant to the first electronic component and is configured to perform the same one or more controlling operations of the vehicle as the first electronic component in response to failure of the first electronic component, the cooling device including a first cooling circuit and a second cooling circuit, the computer program, when executed by a computer, causing the computer to perform the following steps:
cooling the first electronic component and the second electronic component by controlling the first cooling circuit to actively circulate cooling fluid using a respective pump of the first cooling circuit; and
cooling the first electronic component and the second electronic component by controlling the second cooling circuit, which is fluidically separated from the first cooling circuit, to actively circulate cooling fluid using a respective pump of the second cooling circuit;
wherein:
the first cooling circuit includes a first plurality of channels in which the cooling fluid of the first cooling circuit is circulated and in which the cooling fluid of the second cooling circuit is not circulated;
the second cooling circuit includes a second plurality of channels in which the cooling fluid of the second cooling circuit is circulated and in which the cooling fluid of the first cooling circuit is not circulated;
the first plurality of channels and the second plurality of channels are meshed between one another forming a channel mesh under the first electronic component and under the second electronic component so that each of the first electronic component and the second electronic component spans over respective sections of one or more of the first plurality of channels and respective sections of one or more of the second plurality of channels, the first cooling circuit and the second cooling circuit thereby each being configured to independently cool each of the first electronic component and the second electronic component; and
the first electronic component and the second electronic component are arranged in series relative to the first plurality of channels and the second plurality of channels, so that, for each respective one of the channels, the respective channel passes below one of the first and second electronic components before passing under the other of the first and second electronic components with respect to a flow direction of the cooling fluid within the respective channel.

8. The cooling device as recited in claim 1, wherein the first and second electronic components are arranged in series relative to each other and are arranged between the respective pumps of the first cooling circuit and the second cooling circuit.

* * * * *